Oct. 17, 1967

R. L. REBER 3,347,442

STEPPED BONDING WEDGE

Filed May 18, 1965

INVENTOR.
ROBERT L. REBER
BY James M. Nickels
ATTORNEY

United States Patent Office
3,347,442
Patented Oct. 17, 1967

3,347,442
STEPPED BONDING WEDGE

Robert L. Reber, Eatontown, N.J., assignor to The Bendix Corporation, Eatontown, N.J., a corporation of Delaware Filed May 18, 1965, Ser. No. 456,762
5 Claims. (Cl. 228—3)

The present invention relates to apparatus for joining leads to semiconductor devices and more particularly to a bonding tool for use in such apparatus.

The small size of semiconductor devices has complicated the task of connecting leads thereto. The conductive leads are often finer than a human hair. This presented a problem in making a satisfactory bond. Often the bond would have a weak spot which would open up. Or in making the bond a tail would be formed which would short out the device.

The present invention provides a step wedge for use in bonding apparatus which provides a controlled bond and also serves as a cutoff tool.

It is an object of the invention to provide improved means for bonding conductors to a semiconductor device.

Another object of the invention is to provide an improved tool for use in a bonding machine.

Another object of the invention is to provide an improved wedge for a bonding machine.

Another object of the invention is to provide an improved wedge for a bonding machine which also serves as a cutoff tool.

Another object of the invention is to provide means for increasing the yield in bonding wires to semiconductor devices.

The above and other objects and features of the invention will appear more fully hereinafter from a consideration of the following description taken in connection with the accompanying drawing wherein one embodiment is illustrated by way of example.

Figure 1:
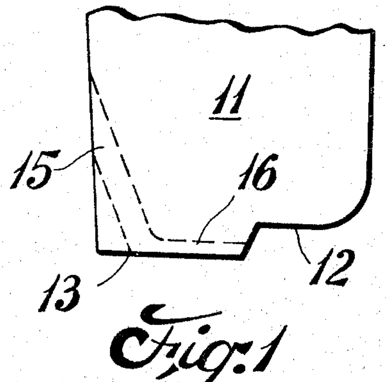
FIGURE 1 is a partial side view of bonding tool embodying the invention.

Referring now to the drawing, in FIGURE 1 a bonding tool or wedge is indicated generally by the numeral 11. The wedge 11 is adapted for use in any conventional bonding apparatus (not shown) such, for example, as the types shown in U.S. Patents 3,128,648 and 3,128,649. It is understood, however, that it is not limited to such types. Only the bonding tip of the wedge 11 is being illustrated in detail as the other end may be formed to fit into the particular bonding apparatus being utilized.

Figure 2:
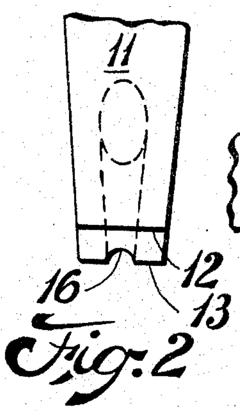
FIGURE 2 is a partial front view of the tool of FIGURE 1.
Figure 3:
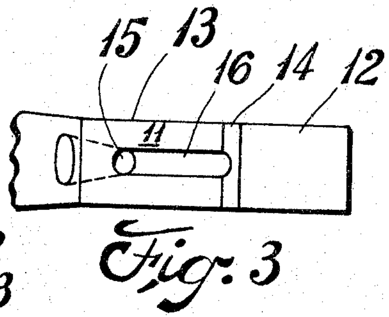
FIGURE 3 is an end view of the tool of FIGURE 1.

The wedge 11 is of a material somewhat harder than the wire to be bonded, for example, tungsten carbide. The wedge 11 has an upper step 12 and a lower step 13. The steps 12 and 13 are joined by an angle section 14. A sloping channel 15 extends through the wedge 11 opening on the step 13. Connecting with the channel 15 is a semicircular groove 16 which extends to the angle section 14, see FIGURES 2 and 3.

Figure 4:
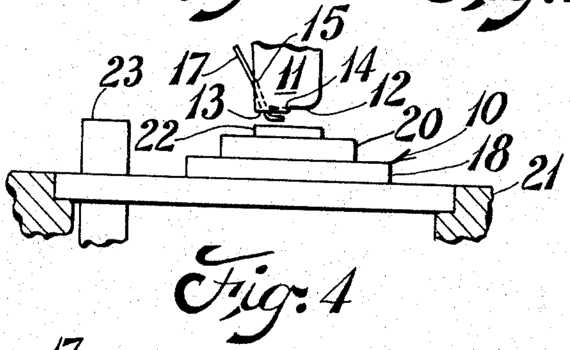
FIGURES 4, 5 and 6 illustrate the operation of the tool of FIGURE 1.
Figure 5:
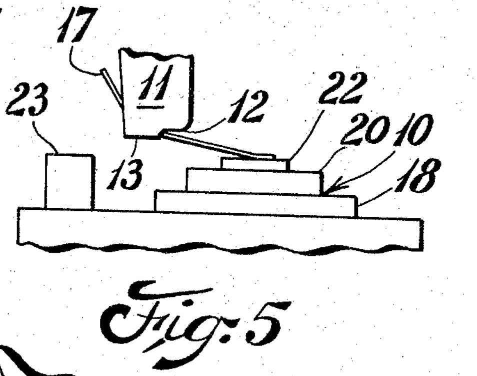
Figure 6:
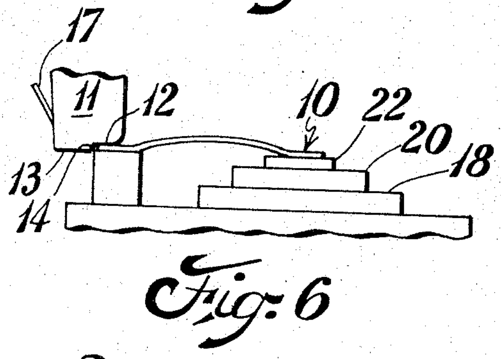

Reference is now made to FIGURES 4, 5 and 6 for an explanation of the operation. A wire 17 of a suitable conducting material, for example, aluminum or gold is fed through the channel 15 from a reel or spool (not shown). The channel 15 is larger in diameter than the wire 17 to permit the wire 17 to be fed therethrough without binding. A portion of the wire 17 extends from the channel 15 into the groove 16 which is of the same diameter as that of the wire. In FIGURE 4, a transistor 18 to which lead 17 is to be bonded has a base portion 19 to which semiconductor body 20 is attached. The base portion 18 is positioned in a suitable holding fixture 21. The step 13 of the wedge 11 is activated into position over a contact 22 which has already been applied to the semiconductor body 20. It is understood that the contact 22 may be a part of the transistor, for example, the emitter. The wire 17 is then compressed between the groove 16 and contact 22 to form a compression bond with the contact 22. The bonding may be either ultrasonic or thermal compression.

Figure 7:
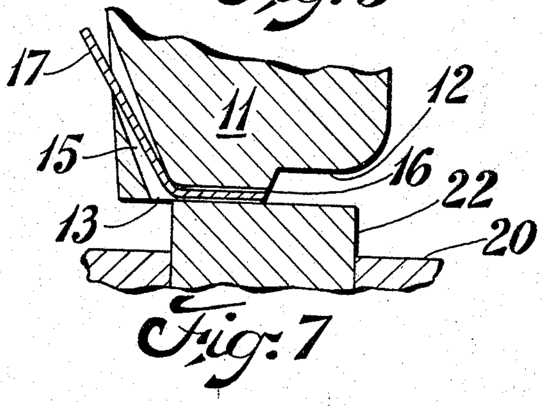
FIGURES 7 and 8 are sectional views to illustrate the features of the tool.
Figure 8:
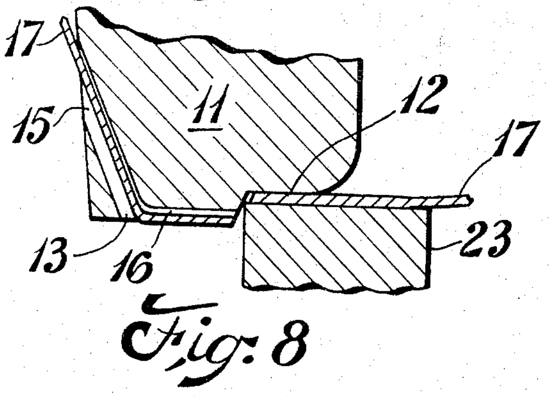

After completing the bond to the contact 22, the wedge 11 is activated towards a post 23 which automatically draws the wire 17 through the channel 15. The movement of the wedge 11 is continued until the step 12 is over the post 23. The wire 17 is then compressed between the step 12 and the post 23 to form a bond between the wire 17 and post 23 (see FIGURE 6). At the same time the angle section 14 shears the wire 17 against the post or bonding pad thus leaving the wire 17 in position for the next bond. The sectional views of FIGURES 7 and 8 illustrate more clearly the bonding as described above.

Figure 9:
FIGURE 9 is a view of a bond made on a semiconductor device.
Figure 10:
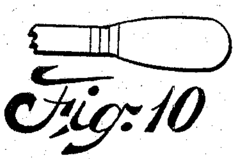
FIGURE 10 is a view of a bond made on a post.

FIGURE 9 illustrates the geometry of a bond made by the step 13 and groove 16 on the semiconductor. FIGURE 10 illustrates the geometry of a bond made by the step 12 on the post.

The step wedge as described offers many advantages. The wire feeds through the wedge thus eliminating the positioning of the wire for each bond. The operation in forming the post bond not only cuts the wire but also positions it for the next bond. Further the bonds have optimum shaping with no weak points to break and no tails to cause shorts. It is easily adapted to conventional apparatus and can be utilized with either ultrasonic or thermal compression, or a combination of the two.

Although only one embodiment of the invention has been illustrated and described, various changes in the form and relative arrangement of the parts, which will now appear to those skilled in the art may be made without departing from the scope of the invention.

What is claimed is:

1. A bonding wedge for bonding a wire to semiconductor devices comprising a member having a stepped-end surface, said stepped-end surface including an upper step and a lower step, an angle section connecting said upper and lower steps, a semicircular groove in said lower step, a passageway extending through said member and connecting with said semicircular groove.

2. A wedge for use in bonding a wire-like member to a predetermined part, comprising a wedge-like member having an end section, said end section having a lower step and an upper step, a slanted section connecting said upper and lower steps, a channel extending from said lower step at least part way through said member for guiding said wire-like member, and a groove extending from said channel to said slanted section in said lower step.

3. The combination as set forth in claim 2 in which said wedge-like member is of tungsten carbide.

4. The combination as set forth in claim 2 in which said groove is the same diameter as the wire-like member to be bonded.

5. A bonding wedge for bonding a wire-like member to make a connection between a semiconductor element and a post comprising a wedge-like member having an upper level and lower level end section, an angular section joining said upper and lower level sections, a channel extending through a portion of said wedge-like member and terminating in said lower level and adapted to guide the wire-like member, a groove in said lower level extending from said channel to said angular section, said lower level section adapted for making a bond between said wire-like material and the semiconductor element, and said upper level section adapted to make a bond between the wire-like material and the post with the angular section adapted to shear said wire-like material.

References Cited

UNITED STATES PATENTS

| | | | |
|---|---|---|---|
| 3,116,655 | 1/1964 | Esopi | 228—44 |
| 3,128,649 | 4/1964 | Avila et al. | 228—1 |
| 3,250,452 | 5/1966 | Angelucci et al. | 228—3 |
| 3,314,582 | 4/1967 | Haigler | 228—3 |

JOHN F. CAMPBELL, *Primary Examiner.*

M. L. FAIGUS, *Assistant Examiner.*